(12) United States Patent
Derderian

(10) Patent No.: US 6,818,249 B2
(45) Date of Patent: Nov. 16, 2004

(54) REACTORS, SYSTEMS WITH REACTION CHAMBERS, AND METHODS FOR DEPOSITING MATERIALS ONTO MICRO-DEVICE WORKPIECES

(75) Inventor: Garo J. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/379,333

(22) Filed: Mar. 3, 2003

(65) Prior Publication Data

US 2004/0173150 A1 Sep. 9, 2004

(51) Int. Cl.[7] ............................................. C23C 16/00
(52) U.S. Cl. .............................. 427/248.1; 427/255.23; 427/255.28; 216/58
(58) Field of Search .................... 427/248.1, 255.23, 427/255.28; 216/58

(56) References Cited

U.S. PATENT DOCUMENTS

| | | | |
|---|---|---|---|
| 5,788,778 A | 8/1998 | Shang et al. | |
| 5,895,530 A | 4/1999 | Shrotriya et al. | |
| 5,932,286 A | 8/1999 | Beinglass et al. | |
| 6,109,206 A | 8/2000 | Maydan et al. | |
| 6,143,077 A | 11/2000 | Ikeda et al. | |
| 6,143,078 A | * 11/2000 | Ishikawa et al. | ............ 118/715 |
| 6,302,965 B1 | 10/2001 | Umotoy et al. | |
| 6,329,297 B1 | 12/2001 | Balish et al. | |
| 6,374,831 B1 | 4/2002 | Chandran et al. | |
| 6,387,207 B1 | 5/2002 | Janakiraman et al. | |
| 6,435,865 B1 | * 8/2002 | Tseng et al. | ................ 432/152 |
| 6,461,436 B1 | 10/2002 | Campbell et al. | |
| 2003/0000473 A1 | 1/2003 | Chae et al. | |
| 2003/0003730 A1 | 1/2003 | Li | |
| 2003/0024477 A1 | 2/2003 | Okuda et al. | |

FOREIGN PATENT DOCUMENTS

WO    WO 02/081771 A2    10/2002

* cited by examiner

*Primary Examiner*—Timothy Meeks
(74) *Attorney, Agent, or Firm*—Perkins Coie LLP

(57) ABSTRACT

Reactors, systems with reaction chambers, and methods for depositing materials onto micro-device workpieces are disclosed herein. In one embodiment, a method for depositing material onto a micro-device workpiece includes flowing a first gas along a first vector across a first portion and toward a center of the micro-device workpiece and flowing a second gas along a second vector across a second portion and toward the center of the micro-device workpiece. The second vector is transverse to the first vector. The method can further include exhausting the first gas from a region proximate to the center of the micro-device workpiece and exhausting the second gas from the region proximate to the center of the micro-device workpiece. Flowing the first gas can include depositing the first gas uniformly from a perimeter region to a center region of the micro-device workpiece.

40 Claims, 3 Drawing Sheets

US 6,818,249 B2

REACTORS, SYSTEMS WITH REACTION CHAMBERS, AND METHODS FOR DEPOSITING MATERIALS ONTO MICRO-DEVICE WORKPIECES

TECHNICAL FIELD

The present invention is related to reactors, systems with reaction chambers, and methods for depositing materials used in the manufacturing of micro-devices.

BACKGROUND

Thin film deposition techniques are widely used in the manufacturing of micro-devices to form a coating on a workpiece that closely conforms to the surface topography. The size of the individual components in the devices is constantly decreasing, and the number of layers in the devices is increasing. As a result, the density of components and the aspect ratios of depressions (e.g., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate.

Such high temperatures are not typically desirable because heating the workpiece can be detrimental to the structures and other materials already formed on the workpiece. Implanted or doped materials, for example, can migrate within the substrate at higher temperatures. On the other hand, if more reactive precursors are used so that the workpiece temperature can be lower, then reactions may occur prematurely in the gas phase before reaching the substrate.

This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer having a thickness of approximately 0.5–1.0 Å, and thus it takes approximately 60-120 cycles to form a solid layer having a thickness of approximately 60 Å.

FIG. 3 schematically illustrates an ALD reactor 10 having a reaction chamber 20 coupled to a gas supply 30 and a vacuum 40. The reactor 10 also includes a heater 50 that supports the workpiece W and a gas dispenser 60 in the reaction chamber 20. The gas dispenser 60 includes a plenum 62 operatively coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$ as shown above in FIG. 2. The vacuum 40 maintains a negative pressure in the chamber to draw the gases from the gas dispenser 60 across the workpiece W and then through an outlet of the reaction chamber 20.

One drawback of ALD processing is that it has a relatively low throughput compared to CVD techniques. For example, ALD processing typically takes about eight to eleven seconds to perform each $A_x$-purge-$B_y$-purge cycle. This results in a total process time of approximately eight to eleven minutes to form a single thin layer of only 60 Å. In contrast to ALD processing, CVD techniques only require about one minute to form a 60 Å thick layer. The low throughput of existing ALD techniques limits the utility of the technology in its current state because ALD may be a bottleneck in the overall manufacturing process.

Another drawback of both CVD and ALD processing is that it is difficult to deposit the precursors uniformly across the workpiece. For example, typical conventional reactors flow the precursors either (a) laterally across the workpiece (not shown) or (b) vertically downward onto a center region of the workpiece and then radially outward across a perimeter region of the workpiece (FIG. 3). The conventional reactors deposit more material on the portion of the workpiece proximate to the gas inlets than the portion of the workpiece proximate to the outlets because the precursors are depleted as they flow over the workpiece. For example, the reactor that flows the precursors downward and then radially outward deposits more material at the center of the workpiece than at the perimeter of the workpiece. Accordingly, there is a need to improve the process of depositing materials in reactors.

SUMMARY

The present invention relates to reactors, systems with reaction chambers, and methods for depositing materials used in the manufacturing of micro-devices. One aspect of the invention is directed to a method for depositing material onto a micro-device workpiece in a reaction chamber. In one embodiment, the method includes flowing a first gas along a first vector across a first portion and toward a center of the micro-device workpiece and flowing a second gas along a second vector across a second portion and toward the center of the micro-device workpiece. The second vector is transverse to the first vector. In one aspect of this embodiment, the method further includes exhausting the first gas from a region proximate to the center of the micro-device workpiece and exhausting the second gas from the region proximate to the center of the micro-device workpiece. In another aspect of this embodiment, flowing the first gas includes depositing a first thickness of the first gas molecules onto the micro-device workpiece proximate to a perimeter and depositing a second thickness of the first gas molecules onto the micro-device workpiece proximate to the center. The first thickness is generally equal to the second thickness.

In another embodiment, the method includes flowing a gas across a surface of the micro-device workpiece from a perimeter region toward a center region and exhausting the gas from the center region of the micro-device workpiece. In one aspect of this embodiment, flowing the gas includes uniformly depositing the gas across a first area from a perimeter to a center of the microdevice workpiece. In another aspect of this embodiment, flowing the gas includes decreasing the density of the gas as the gas moves toward the center of the micro-device workpiece. In another aspect of this embodiment, flowing the gas includes flowing a first precursor. The method can further include flowing a second precursor across and toward the center of the micro-device workpiece at least partially simultaneously with the first precursor flow. Alternatively, the method can further include flowing a purge gas toward the center of the micro-device workpiece after terminating the first precursor flow and flowing a second precursor after terminating the purge gas flow.

Another aspect of the invention is directed to a reactor for depositing material onto a micro-device workpiece in a reaction chamber. In one embodiment, the reactor includes a reaction chamber and a gas distributor carried by the reaction chamber. The gas distributor includes a first aperture arranged to flow a first gas across a first portion and toward a center of the micro-device workpiece and a second aperture arranged to flow a second gas across a second portion and toward the center of the micro-device workpiece. The first portion of the micro-device workpiece is different than the second portion. In one aspect of this embodiment, the reactor further includes an exhaust conduit coupled to the reaction chamber. The exhaust conduit has a port proximate to a center of the micro-device workpiece to remove the first and second gases from the reaction chamber.

DETAILED DESCRIPTION

The following disclosure describes several embodiments of reactors having gas distributors, systems including reaction chambers, and methods for depositing materials onto micro-device workpieces. Many specific details of the invention are described below with reference to reactors for depositing materials onto micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers such as silicon or gallium arsenide wafers, glass substrates, insulative substrates, and many other types of materials.

Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Moreover, the term "transverse" is used throughout to mean oblique, perpendicular, and/or not parallel. Several embodiments in accordance with the invention are set forth in FIGS. 4A–6 and the following text to provide a thorough understanding of particular embodiments of the invention. A person skilled in the art will understand, however, that the invention may have additional embodiments, or that the invention may be practiced without several of the details of the embodiments shown in FIGS. 4A–6.

A. Deposition Systems

Figure 1A:
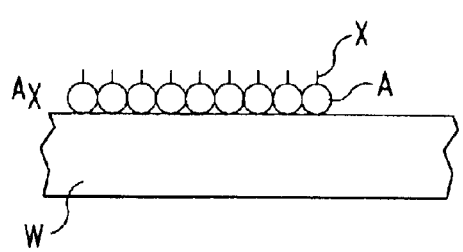
FIGS. 1A and 1B are schematic cross-sectional views of stages in ALD processing in accordance with the prior art.
Figure 1B:
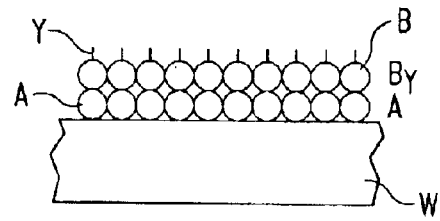
Figure 2:
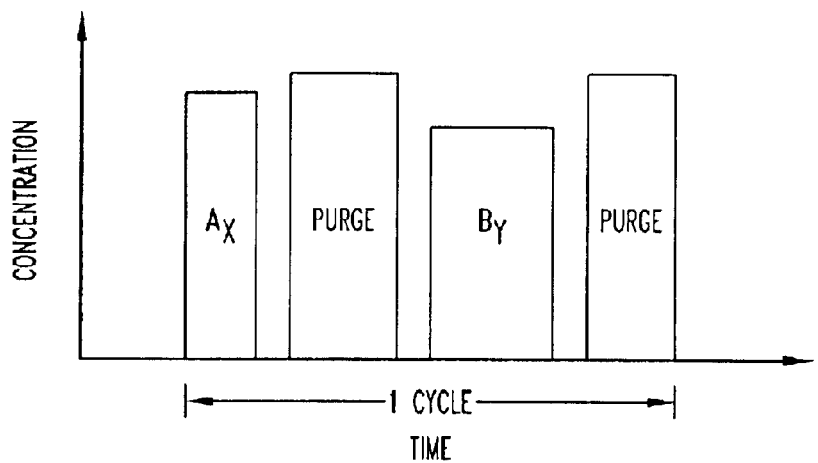
FIG. 2 is a graph illustrating a cycle for forming a layer using ALD techniques in accordance with the prior art.
Figure 3:
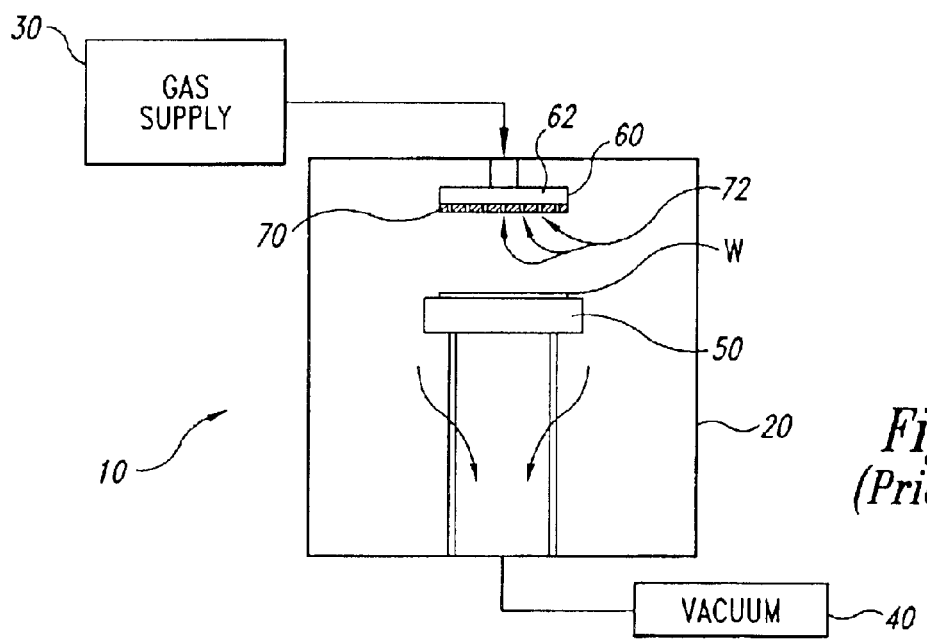
FIG. 3 is a schematic representation of a system including a reactor for depositing a material onto a micro-device workpiece in accordance with the prior art.
Figure 4A:
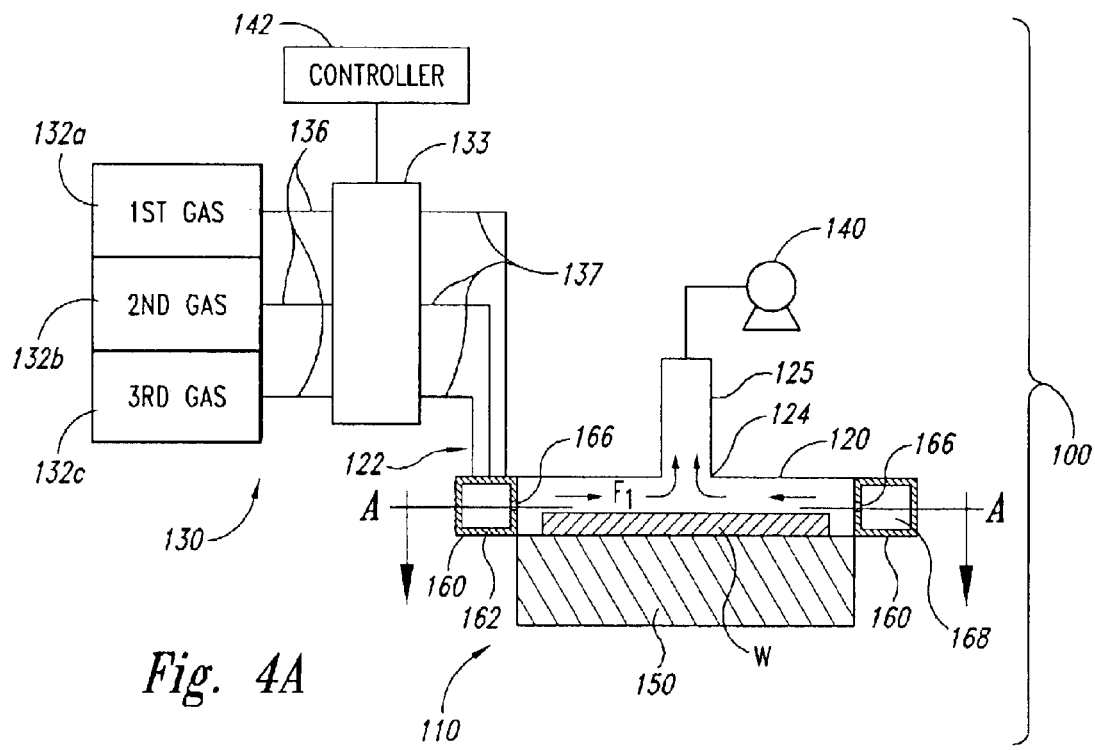
FIG. 4A is a schematic representation of a system including a reactor for depositing material onto a micro-device workpiece in accordance with one embodiment of the invention.

FIG. 4A is a schematic representation of a system 100 for depositing material onto a micro-device workpiece W in accordance with one embodiment of the invention. In this embodiment, the system 100 includes a reactor 110 having a reaction chamber 120 coupled to a gas supply 130 and a vacuum 140. The system 100 also includes a gas distributor 160 coupled to the reaction chamber 120 to dispense the gas(es) into the reaction chamber 120 and onto the workpiece W.

The gas supply 130 includes a plurality of gas sources 132 (identified individually as 132a–c), a valve assembly 133 having a plurality of valves, and a plurality of gas supply lines 136 and 137. The gas sources 132 can include a first gas source 132a for providing a first gas, a second gas source 132b for providing a second gas, and a third gas source 132c for providing a third gas. The first and second gases can be first and second precursors, respectively. The third gas can be a purge gas. The first and second precursors are the gas or vapor phase constituents that react to form the thin, solid layer on the workpiece W. The purge gas can be a suitable type of gas that is compatible with the reaction chamber 120 and the workpiece W. The gas supply 130 can include more gas sources 132 for applications that require additional precursors or purge gases in other embodiments. In additional embodiments, the gas sources 132 can include one or more etchants for deposition onto a micro-device workpiece during etching. The valve assembly 133 is operated by a controller 142 that generates signals for controlling the flow of gases through the reaction chamber 120 for ALD and CVD applications. For example, the controller 142 can be programmed to operate the valve assembly 133 to pulse the gases individually through the gas distributor 160 in ALD applications or mix selected precursors in the gas distributor 160 in CVD applications.

In the illustrated embodiment, the reactor 110 also includes a workpiece support 150 to hold the workpiece W in the reaction chamber 120. In one aspect of this embodiment, the workpiece support 150 can be heated to bring the workpiece W to a desired temperature for catalyzing the reaction between the first gas and the second gas at the surface of the workpiece W. For example, the workpiece support 150 can be a plate with a heating element. The workpiece support 150, however, may not be heated in other applications.

B. Gas Distributors

The gas distributor 160 flows the gas(es) across the workpiece W in the reaction chamber 120 to deposit material onto the workpiece W. In the illustrated embodiment, the gas distributor 160 is carried by the reaction chamber 120 and has an annular configuration circumscribing the workpiece W. The gas distributor 160 is coupled to the gas supply lines 137 to receive the gases through an inlet 122. The gas distributor 160 includes a wall 162, an antechamber or conduit 168 defined by the wall 162, and a plurality of apertures 166 in the wall 162. The apertures 166 are arranged to flow the gases across the workpiece W from a perimeter region to an interior region. More specifically, the gases flow radially inward toward the center of the workpiece W and generally parallel to a surface of the workpiece W. At the center of the workpiece W, the vacuum 140 removes the gases through an exhaust conduit 125. For example, a gas flow "$F_1$" enters the reaction chamber 120 through the apertures 166 in the gas distributor 160, flows over the workpiece W, and then is exhausted from the reaction chamber 120 through an outlet 124.

One feature of the embodiment illustrated in FIG. 4A is that the outlet 124 is positioned over the center of the workpiece W so that the gases are exhausted upward, out of the reaction chamber 120. Moreover, the gases are typically heated by the workpiece W, thereby decreasing the density of the gases as they move toward the center of the workpiece W. Accordingly, one advantage of this embodiment is that the decreased density of the gases toward the center of the workpiece W assists the flow of the gases through and out of the reaction chamber 120. The improved gas flow reduces or eliminates the recirculation zones within the reaction chamber 120. Recirculation zones make purging the reaction chamber 120 more difficult.

Figure 4B:
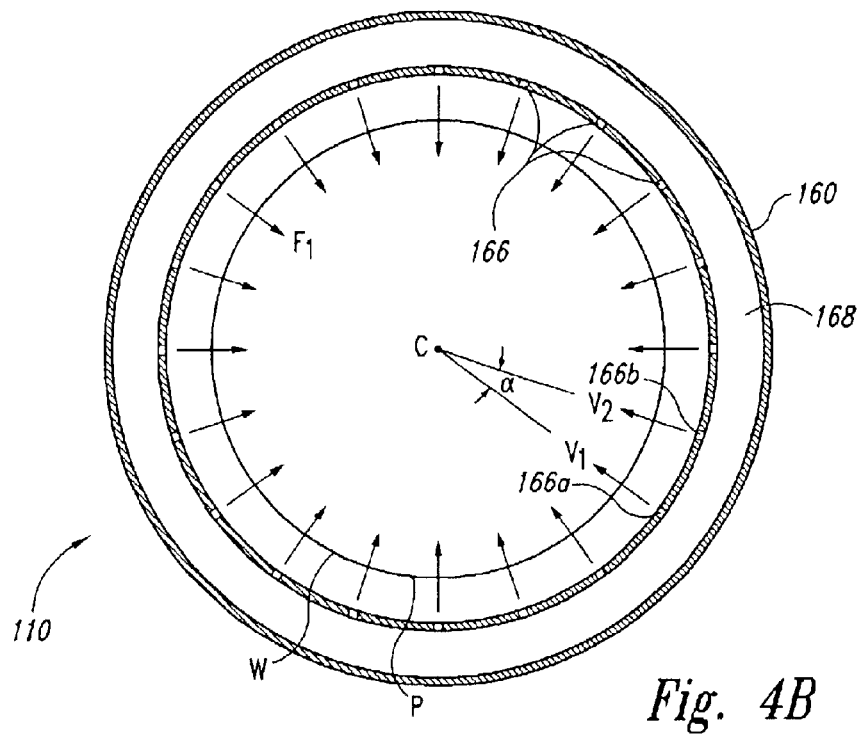
FIG. 4B is a schematic top plan view of the reactor of FIG. 4A taken along line A—A.

FIG. 4B is a schematic top plan view of the reactor 110 of FIG. 4A taken along line A—A. In one aspect of this embodiment, the apertures 166 are arranged in the gas distributor 160 generally uniformly about the workpiece W. The apertures 166 are oriented to flow the gases from a perimeter region toward the center C of the workpiece W. For example, a first aperture 166a is configured to flow a gas along a first vector $V_1$ radially inward across the workpiece W, and a second aperture 166b is configured to flow the gas along a second vector $V_2$ radially inward across the workpiece W. The first vector $V_1$ intersects the second vector $V_2$ at an angle a proximate to the center C of the workpiece W.

In additional embodiments, the first and second apertures can be configured to flow the gas at an angle relative to the center C of the workpiece W to create a vortex over the workpiece W. In other embodiments, apertures can be configured to flow the gas in diametrically opposed directions. In additional embodiments, the apertures can be configured to flow the gas over a specific segment of the workpiece W. In other embodiments, such as in dry etch applications, the reaction chamber can also include an electrode and the workpiece W can be electrically biased.

One feature of this embodiment is that the gas flows radially inward from a perimeter P of the workpiece W toward the center C of the workpiece W. The gas is depleted as the gas flows across the workpiece W because portions of the gas are deposited on the workpiece W. Moreover, the surface area of the workpiece W serviced by each aperture decreases as the gas from the aperture flows toward the center C of the workpiece W. Accordingly, one advantage of this embodiment is that the gas is deposited generally uniformly across the workpiece W because, as the gas is depleted, there is less surface area on the workpiece W onto which the gas is deposited.

Referring to FIGS. 4A and 4B, in one aspect of this embodiment, the conduit 168 receives the gases from the gas supply lines 137 and distributes the gases to the apertures 166. The gas distributor 160 can include injectors to project the gases through the apertures 166, and/or the negative pressure caused by the vacuum 140 can draw the gases through the apertures 166. Accordingly, in operation, a first gas flows from the gas supply lines 137, through the conduit 168 and apertures 166, and into the reaction chamber 120. In additional embodiments, such as in ALD applications, a purge gas and then a second gas can be dispensed into the reaction chamber 120. In other embodiments, such as in CVD applications, the first and second gases can be mixed together and then provided to the gas distributor 160. Alternatively, the first and second gases can be mixed together in the gas distributor 160 or in the reaction chamber 120. In additional embodiments, such as those described below with reference to FIG. 5, each gas can have a dedicated port or aperture in the gas distributor 160.

Figure 5:
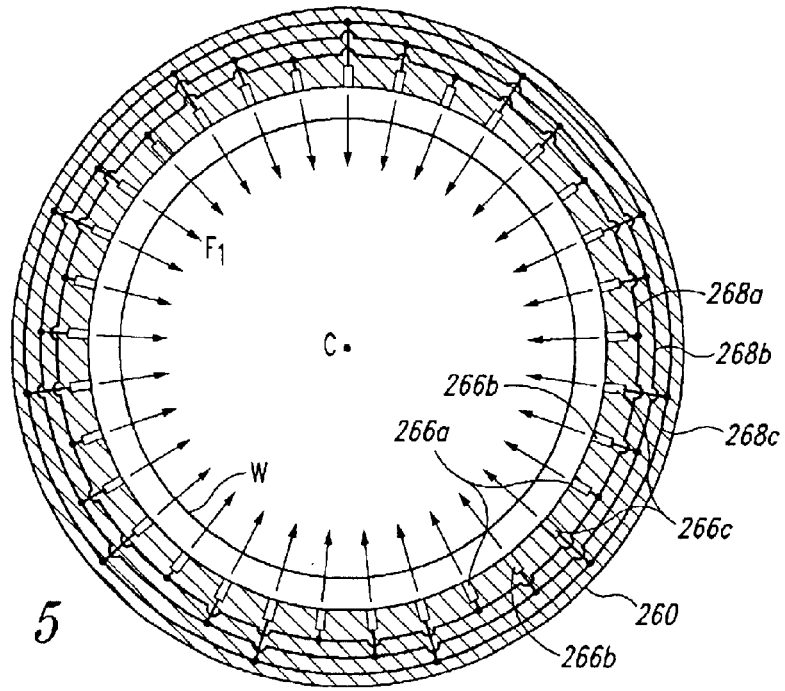
FIG. 5 is a schematic top plan view of a gas distributor in accordance with another embodiment of the invention.

FIG. 5 is a schematic top plan view of a gas distributor 260 in accordance with another embodiment of the invention. The gas distributor 260 includes a first gas conduit 268a coupled to a plurality of first apertures 266a, a second gas conduit 268b coupled to a plurality of second apertures 266b, and a third gas conduit 268c coupled to a plurality of third apertures 266c. The first gas conduit 268a can be coupled to the first gas source 132a (FIG. 4A) to flow the first gas through the first apertures 266a and radially inward across the workpiece W. Similarly, the second gas conduit 268b can be coupled to the second gas source 132b (FIG. 4A) to flow the second gas through the second apertures 266b and radially inward across the workpiece W. Similarly, the third gas conduit 268c can be coupled to the third gas source 132c (FIG. 4A) to flow the third gas through the third apertures 266c and radially inward across the workpiece W. In one aspect of this embodiment, the first, second, and third apertures 266a–c alternate and are spaced apart from each other so that each gas is dispensed uniformly across the workpiece W. In other embodiments, the gas distributor can also include injectors as described above with reference to FIGS. 4A and 4B. In additional embodiments, the gas distributor can have a different number of gas conduits and/or apertures.

D. Other Reactors

Figure 6:
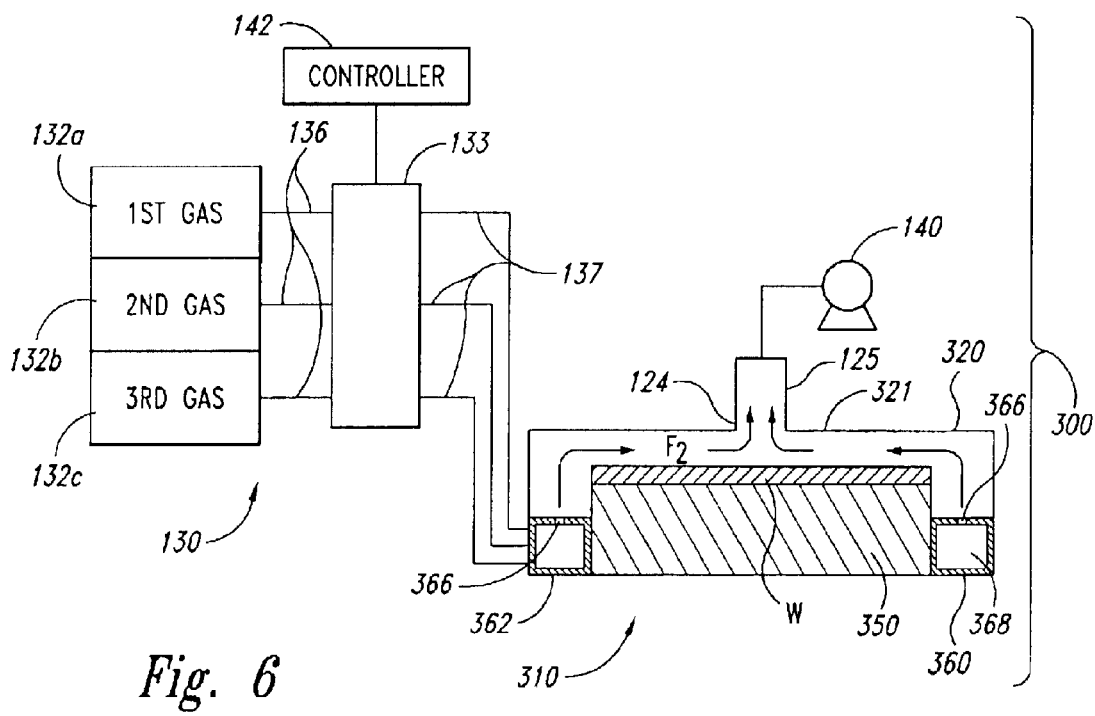
FIG. 6 is a schematic representation of a system including a reactor for depositing material onto a micro-device workpiece in accordance with another embodiment of the invention.

FIG. 6 is a schematic representation of a system 300 for depositing material onto a micro-device workpiece W in accordance with another embodiment of the invention. The system 300 is generally similar to the system 100 described above with reference to FIG. 4A. For example, the system 300 includes a reactor 310 having a reaction chamber 320 coupled to the gas supply 130 and the vacuum 140. The system 300 also includes a gas distributor 360 coupled to the reaction chamber 320 to dispense gases into the reaction chamber 320 for deposit onto the workpiece W. The gas distributor 360 is similar to the gas distributor 160 described above with reference to FIGS. 4A and 4B. For example, the gas distributor 360 includes a wall 362, a conduit 368 defined by the wall 362, and a plurality of apertures 366 in the wall 362. The apertures 366 are arranged to flow the gases into the reaction chamber 320 and across the workpiece W. For example, a gas flow "$F_2$" enters the reaction chamber 320 through the apertures 366 in the gas distributor 360, flows radially inward across the workpiece W, and then is exhausted through the outlet 124. In additional embodiments, the gas distributor 360 can include gas conduits having dedicated apertures, such as those described above with reference to FIG. 5. In other embodiments, the gas distributor 360 can be coupled to the reaction chamber 320 at a different location. For example, the gas distributor 360 can be coupled to an upper wall 321 of the reaction chamber 320 to flow the gases downward and then radially inward across the workpiece W.

In one aspect of this embodiment, the reactor 310 also includes a workpiece support 350 having a heater. The gas distributor 360 is arranged such that the apertures 366 flow the gases proximate to the heated workpiece support 350 to heat the gases before the gases flow across the workpiece W. In other embodiments, the workpiece support 350 may not include a heater or heat the gases before the gases flow across the workpiece W.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method for depositing material onto a micro-device workpiece in a reaction chamber, the method comprising:
flowing a first gas along a first vector across a first portion and toward a center of the micro-device workpiece;
flowing a second gas along a second vector across a second portion and toward the center of the micro-device workpiece, wherein the second vector is transverse to the first vector;
exhausting the first gas from a region proximate to the center of the micro-device workpiece via an outlet of the reaction chamber over the region proximate to the center of the workpiece; and
exhausting the second gas from the region proximate to the center of the microdevice workpiece via the outlet of the reaction chamber.

2. The method of claim 1 wherein:
the first portion comprises a first area from a perimeter to the center of the micro-device workpiece;
the second portion comprises a second area from the perimeter to the center of the micro-device workpiece, wherein the second area is different than the first area;
flowing the first gas comprises generally uniformly depositing the first gas across the first area of the micro-device workpiece; and flowing the second gas comprises generally uniformly depositing the second gas across the second area of the micro-device workpiece.

3. The method of claim 1 wherein:
flowing the first gas along the first vector comprises passing the first gas along the first vector from a first inlet; and
flowing the second gas along the second vector comprises passing the second gas along the second vector from a second inlet.

4. The method of claim 1 wherein:
flowing the first gas comprises decreasing the flux of the first gas as the first gas moves toward the center of the micro-device workpiece; and
flowing the second gas comprises decreasing the flux of the second gas as the second gas moves toward the center of the micro-device workpiece.

5. The method of claim 1 wherein flowing the first gas comprises:
depositing a first thickness of the first gas molecules onto the micro-device workpiece proximate to a perimeter; and
depositing a second thickness of the first gas molecules onto the micro-device workpiece proximate to the center, wherein the first thickness is generally equal to the second thickness.

6. The method of claim 1, further comprising:
heating the first gas with a heater proximate to the micro-device workpiece before flowing the first gas; and
heating the second gas with the heater proximate to the micro-device workpiece before flowing the second gas.

7. The method of claim 1 wherein flowing the first gas and flowing the second gas occur at least partially simultaneously.

8. The method of claim 1 wherein flowing the second gas occurs after terminating the first gas flow.

9. The method of claim 1, further comprising flowing a third gas toward the center of the micro-device workpiece.

10. The method of claim 1 wherein:
flowing the first gas comprises flowing a first precursor;
flowing the second gas comprises flowing a second precursor; and
flowing the first precursor and flowing the second precursor occur at least partially simultaneously.

11. The method of claim 1, further comprising:
flowing a third gas toward the center of the micro-device workpiece;
wherein flowing the first gas comprises flowing a first precursor and then terminating the first precursor flow;
wherein flowing the third gas comprises flowing a purge gas after terminating the first precursor flow and then terminating the purge gas flow; and
wherein flowing the second gas comprises flowing a second precursor after terminating the purge gas flow.

12. The method of claim 1, further comprising:
flowing a third gas toward the center of the micro-device workpiece;
wherein flowing the first gas comprises flowing a first precursor;
wherein flowing the second gas comprises flowing a second precursor at least approximately simultaneously with flowing the first precursor; and
wherein flowing the third gas comprises flowing a purge gas after terminating flowing the first and second precursors.

13. The method of claim 1 wherein flowing the first and second gases comprises flowing an etchant.

14. A method for depositing material onto a micro-device workpiece in a reaction chamber, the method comprising:

flowing a first gas radially inward across a first portion of the micro-device workpiece from a perimeter region to an interior region of the workpiece;

flowing a second gas radially inward across a second portion of the micro-device workpiece from the perimeter region to the interior region, the second portion being different than the first portion;

exhausting the first gas from the interior region of the micro-device workpiece via an outlet of the reaction chamber over the interior region of the workpiece; and exhausting the second gas from the interior region of the micro-device workpiece via the outlet of the reaction chamber.

15. The method of claim 14 wherein:

the first portion comprises a first area from a perimeter to a center of the microdevice workpiece;

the second portion comprises a second area from the perimeter to the center of the micro-device workpiece;

flowing the first gas comprises generally uniformly depositing the first gas across the first area of the micro-device workpiece; and flowing the second gas comprises generally uniformly depositing the second gas across the second area of the micro-device workpiece.

16. The method of claim 14 wherein:

flowing the first gas comprises decreasing the density of the first gas as the first gas moves toward a center of the micro-device workpiece; and flowing the second gas comprises decreasing the density of the second gas as the second gas moves toward the center of the micro-device workpiece.

17. The method of claim 14 wherein flowing the first gas comprises:

depositing a first thickness of the first gas molecules onto the micro-device workpiece proximate to a perimeter; and depositing a second thickness of the first gas molecules onto the micro-device workpiece proximate to a center, wherein the first thickness is generally equal to the second thickness.

18. The method of claim 14 wherein:

flowing the first gas comprises flowing a first precursor;

flowing the second gas comprises flowing a second precursor; and flowing the first precursor and flowing the second precursor occur at least partially simultaneously.

19. The method of claim 14, further comprising:

flowing a third gas toward a center of the micro-device workpiece;

wherein flowing the first gas comprises flowing a first precursor and then terminating the first precursor flow;

wherein flowing the third gas comprises flowing a purge gas after terminating the first precursor flow and then terminating the purge gas flow; and wherein flowing the second gas comprises flowing a second precursor after terminating the purge gas flow.

20. The method of claim 14, further comprising:

flowing a third gas toward a center of the micro-device workpiece;

wherein flowing the first gas comprises flowing a first precursor;

wherein flowing the second gas comprises flowing a second precursor at least approximately simultaneously with flowing the first precursor; and wherein flowing the third gas comprises flowing a purge gas after terminating flowing the first and second precursors.

21. A method for depositing material onto a surface of a micro-device workpiece in a reaction chamber, the method comprising:

passing a first gas through a first inlet in a first direction and across a first portion of the micro-device workpiece in the first direction, wherein the first direction is generally parallel to the surface of the micro-device workpiece:

passing a second gas through a second inlet in a second direction and across a second portion of the micro-device workpiece in the second direction, wherein the second direction is transverse to the first direction and generally parallel to the surface of the micro-device workpiece;

exhausting the first gas from a region proximate to a center of the micro-device workpiece via an outlet of the reaction chamber over the region proximate to the center of the workpiece; and exhausting the second gas from the region proximate to the center of the micro-device workpiece via the outlet of the reaction chamber.

22. The method of claim 21 wherein:

the first portion comprises a first area from a perimeter to the center of the micro-device workpiece;

the second portion comprises a second area from the perimeter to the center of the micro-device workpiece;

passing the first gas comprises generally uniformly depositing the first gas across the first area of the micro-device workpiece; and passing the second gas comprises generally uniformly depositing the second gas across the second area of the micro-device workpiece.

23. The method of claim 21 wherein passing the first gas comprises:

depositing a first thickness of the first gas molecules onto the surface of the micro-device workpiece proximate to a perimeter; and depositing a second thickness of the first gas molecules onto the surface of the micro-device workpiece proximate to the center, wherein the first thickness is generally equal to the second thickness.

24. The method of claim 21 wherein:

passing the first gas comprises passing a first precursor;

passing the second gas comprises passing a second precursor; and passing the first precursor and passing the second precursor occur at least partially simultaneously.

25. The method of claim 21, further comprising:

passing a third gas through a third inlet and toward the center of the micro-device workpiece;

wherein passing the first gas comprises flowing a first precursor and then terminating the first precursor flow;

wherein passing the third gas comprises flowing a purge gas after terminating the first precursor flow and then terminating the purge gas flow; and wherein passing the second gas comprises flowing a second precursor after terminating the purge gas flow.

26. A method for depositing material onto a surface of a micro-device workpiece in a reaction chamber, the method comprising:

flowing a gas across the surface from a perimeter region toward a center region of the micro-device workpiece; and exhausting the gas from the center region of the micro-device workpiece via an outlet of the reaction chamber over the center region of the workpiece.

27. The method of claim 26 wherein flowing the gas comprises uniformly depositing the gas across a first area from a perimeter to a center of the micro-device workpiece.

28. The method of claim 26 wherein flowing the gas comprises decreasing the density of the gas as the gas moves toward the center region of the micro-device workpiece.

29. The method of claim 26 wherein flowing the gas comprises:

depositing a first thickness of the gas molecules onto the surface of the micro-device workpiece proximate to a perimeter; and depositing a second thickness of the gas molecules onto the surface of the micro-device workpiece proximate to a center, wherein the first thickness is generally equal to the second thickness.

30. The method of claim 26 wherein flowing the gas comprises flowing a first precursor, and wherein the method further comprises:

flowing a second precursor across the surface from the perimeter region toward the center region of the micro-device workpiece, and wherein flowing the first precursor and flowing the second precursor occur at least partially simultaneously.

31. The method of claim 26 wherein flowing the gas comprises flowing a first precursor and then terminating the first precursor flow, and wherein the method further comprises:

flowing a purge gas toward the center region of the micro-device workpiece after terminating the first precursor flow and then terminating the purge gas flow; and flowing a second precursor after terminating the purge gas flow.

32. The method of claim 26 wherein flowing the gas comprises flowing a first precursor, and wherein the method further comprises:

flowing a second precursor at least approximately simultaneously with flowing the first precursor; and flowing a purge gas toward the center region of the micro-device workpiece after terminating flowing the first and second precursors.

33. The method of claim 26 wherein flowing the gas comprises flowing a first gas in a first direction, and wherein the method further comprises:

flowing a second gas across the surface from the perimeter region to the center region in a second direction different than the first direction.

34. The method of claim 26 wherein flowing the gas comprises flowing a first gas in a first direction, and wherein the method further comprises:

flowing a second gas across the surface from the perimeter region to the center region in a second direction different than the first direction; and flowing a third gas across the surface from the perimeter region to the center region in a third direction.

35. A method for depositing material onto a micro-device workpiece in a reaction chamber, the method comprising:

flowing a first gas along a first direction across a first portion of the micro-device workpiece, the first gas flow traveling generally parallel to the micro-device workpiece from a perimeter region to a central region;

flowing a second gas along a second direction across a second portion of the micro-device workpiece, the second gas flow traveling generally parallel to the micro-device workpiece from the perimeter region to the central region, and the second direction being different than the first direction; and exhausting the first and/or second gas from the central region of the micro-device workpiece via an outlet of the reaction chamber over the central region of the workpiece.

36. The method of claim 35 wherein:

the first portion comprises a first segment from the perimeter region to the central region of the micro-device workpiece;

the second portion comprises a second segment from the perimeter region to the central region of the micro-device workpiece;

flowing the first gas comprises generally uniformly depositing the first gas across the first segment of the micro-device workpiece; and flowing the second gas comprises generally uniformly depositing the second gas across the second segment of the micro-device workpiece.

37. The method of claim 35 wherein flowing the first gas comprises:

depositing a first thickness of the first gas molecules onto the micro-device workpiece proximate to the perimeter region; and depositing a second thickness of the first gas molecules onto the micro-device workpiece proximate to the central region, wherein the first thickness is generally equal to the second thickness.

38. The method of claim 35 wherein:

flowing the first gas comprises flowing a first precursor;

flowing the second gas comprises flowing a second precursor; and flowing the first precursor and flowing the second precursor occur at least partially simultaneously.

39. The method of claim 35, further comprising:

flowing a third gas toward the central region of the micro-device workpiece;

wherein flowing the first gas comprises flowing a first precursor and then terminating the first precursor flow;

wherein flowing the third gas comprises flowing a purge gas after terminating the first precursor flow and then terminating the purge gas flow; and wherein flowing the second gas comprises flowing a second precursor after terminating the purge gas flow.

40. The method of claim 35, further comprising:

flowing a third gas toward the central region of the micro-device workpiece;

wherein flowing the first gas comprises flowing a first precursor;

wherein flowing the second gas comprises flowing a second precursor at least approximately simultaneously with flowing the first precursor; and wherein flowing the third gas comprises flowing a purge gas after terminating flowing the first and second precursors.

* * * * *